United States Patent [19]

Gelabert

[11] 3,742,368

[45] June 26, 1973

[54] PULSE GENERATOR USING SCHOTTKY EFFECT TRANSISTORS

[75] Inventor: Amando E. Gelabert, San Jose, Calif.

[73] Assignee: Signetics Corporation, Sunnyvale, Calif.

[22] Filed: Apr. 24, 1972

[21] Appl. No.: 246,884

[52] U.S. Cl.................. 307/260, 307/265, 307/268, 307/279, 307/293, 307/299, 307/300, 307/303, 307/317

[51] Int. Cl. ............................................ H03k 5/00

[58] Field of Search.................... 307/260, 265, 268, 307/300, 254, 293, 273, 279, 303, 299

[56] References Cited

UNITED STATES PATENTS

| | | | |
|---|---|---|---|
| 3,210,561 | 10/1965 | Ullman | 307/254 |
| 3,553,484 | 1/1971 | Gassmann | 307/300 X |
| 3,564,281 | 2/1971 | Tokunaga et al. | 307/254 X |
| 3,602,735 | 8/1971 | Lodi | 307/268 X |
| 3,654,490 | 4/1972 | Kan | 307/262 X |

*Primary Examiner*—Stanley D. Miller, Jr.
*Attorney*—Paul D. Flehr et al.

[57] ABSTRACT

A pulse generating circuit which produces a single output pulse in response to a step signal change at its input. The circuit includes first, second and third transistors with the first and third transistors having commonly connected outputs. The first transistor is driven by the input signal and it in turn drives the second transistor which in turn drives the third transistor. In accordance with one embodiment the first and third transistors having commonly connected outputs are Schottky effect transistors having a very small turn off delay compared to the turn off delay of the second transistor. The first and second transistors are normally on so that the output terminal is low. The third transistor is normally off. In response to a step signal change at the input of the first transistor, the first transistor goes off. Since the second transistor is a slow turn off device compared to the first and third transistors, the third transistor also stays off for a time. With both the first and third transistors off the output terminal goes high. After a period equal to the turn off delay of the second transistor, however, the second transistor turns off which turns on the third transistor, thus causing the output terminal to again go low. The duration of this pulse at the output terminal is proportional to the turn off delay of the second transistor.

9 Claims, 7 Drawing Figures

PULSE GENERATOR USING SCHOTTKY EFFECT TRANSISTORS

BACKGROUND OF THE INVENTION

This invention pertains to a pulse generating circuit which in response to a step signal change at its input produces a single pulse at its output. Such pulse generating circuits are useful for timing and other applications. The prior art does, of course, contain many circuits for generating an output pulse in response to a step change on an input. The whole field of one shot multivibrators relates to such circuits. Almost all such circuits, however, require capacitors and are relatively complex circuits.

SUMMARY OF THE INVENTION

It is an object of this invention to provide a novel pulse generating circuit for generating a single output pulse in response to a step signal change at an input.

It is another object of this invention to provide a novel pulse generating circuit which utilizes no capacitors.

It is another object of this invention to provide a novel pulse generating circuits for generating a pulse in the nanosecond range at an output in response to step signal change at an input.

Briefly, in accordance with one embodiment of the invention, first, second and third transistors are provided. The first and third transistors are coupled at an output terminal and the first transistor is driven by the input. The first transistor drives a second transistor which, in turn, drives the third transistor. With the input, say, at a high level, the first and second transistors are normally on and the third transistor is normally off. When the input goes low, for example, the first transistor is turned off which after a turn off delay of the second transistor turns off the second transistor, which, in turn, turns on the third transistor. The first and third transistors are of a type having substantially less turn on and turn off delay than the second transistor. Therefore, when the first transistor turns off the output terminal goes high and stays high during the time that the second transistor is turning off. When the second transistor does finally turn off the third transistor is turned on and the output again goes low. In this manner an output pulse is generated having a pulse duration proportional to the turn off delay of the second transistor.

DETAILED DESCRIPTION

Throughout this description the terms "on" and "off" are used to characterize the conductive state of transistors. In accordance with the usual terminology in the art, "on" means that a transistor is in a conducting state and "off" means that a transistor is in a nonconductive state. In a similar fashion, the terms "going high" and "going low" are utilized in this description to refer to potential or voltage excusions of a signal.

Figure 1:
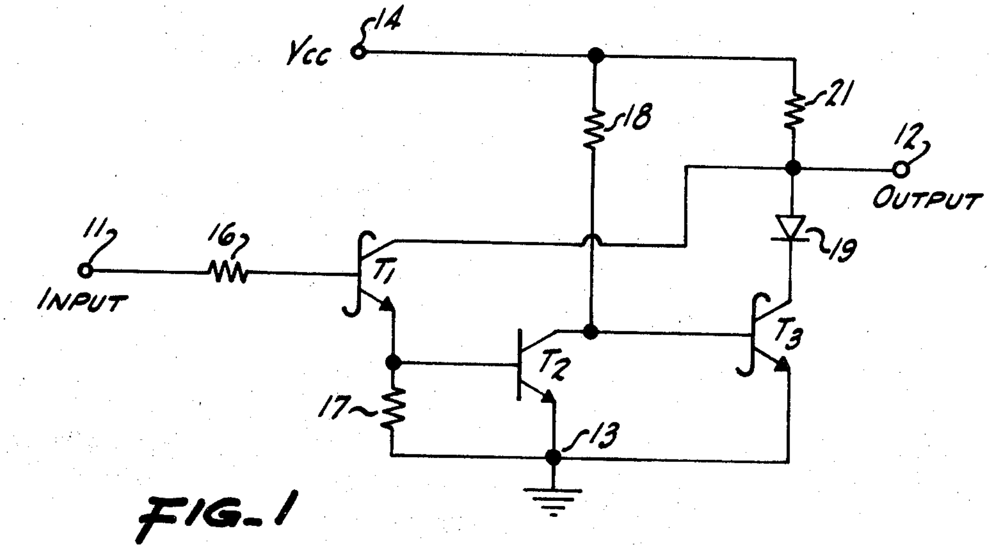
FIG. 1 is a schematic circuit diagram of one embodiment of a pulse generating circuit in accordance with this invention.

Referring to FIG. 1, the pulse generating circuit of this invention includes an input terminal 11, an output terminal 12, a reference potential terminal 13, and a terminal 14 which is adapted to be connected to a source of bias voltage $V_{cc}$. The input terminal 11 is coupled through a resistor 16 to the input base electrode of a transistor T1. The output collector electrode of Transistor T1 is connected to the output terminal 12 and the output emitter electrode of transistor T1 is connected through a resistor 17 to the reference potential terminal 13. The output emitter electrode of transistor T1 is also connected to the input base electrode of a transistor T2. The output collector electrode of transistor T2 is connected through a resistor 18 to the terminal 14 and also connected to the input base electrode of a transistor T3. The output collector electrode of transistor T3 is connected through a Schottky diode 19 to the output terminal 12. The output terminal 12 is connected through a resistor 21 to the terminal 14. The output emitter electrode of both transistors T2 and T3 are connected to the reference potential terminal 13.

In accordance with this invention, the transistors T1 and T3 are Schottky effect transistors whereas the transistor T2 is a conventional transistor. As known to those skilled in the art, a Schottky effect transistor includes relatively large area metallization for a base contact which metallization overlies and is in contact with a portion of the collector region of the transistor. As further known to those skilled in the art, this produces a metal-semiconductor rectifying contact which has the effect of reducing minority carrier storage to the point where the turn on and turn off delays of such a transistor are essentially eliminated or are at least very short. Accordingly, Schottky effect transistors switch very rapidly and have very small turn on and turn off delays as compared to conventional transistors.

In operation, with the NPN transistors shown in FIG. 1, the input terminal 11 is high so that the transistor T1 is conducting, which causes the output terminal 12 to be low. With transistor T1 conducting transistor T2 is also conducting due to the voltage developed across impedance 17, but transistor T3 is essentially connected through transistor T2 to the reference potential terminal 13 which may be ground, for example, and is therefore not conducting. When the signal at the input terminal 11 goes low, transistor T1 turns off very rapidly due to the fact that it is a Schottky effect transistor. This causes the signal at the output terminal 12 to go high. Transistor T2 is turned off by transistor T1 but due to the fact that it is a relatively slow switching transistor, transistor T2 does not turn off immediately when transistor T1 turns off. During this turn off delay of transistor T2 the signal at the output terminal 12 remains high. When transistor T2 does finally turn off, this turns on transistor T3 which is also a Schottky effect transistor and hence a very rapid switching transistor. When transistor T3 turns on, the signal at output terminal 12 thus goes low again. Thus a step signal change at the input terminal 11 produces a single pulse at the output terminal 12 with the pulse duration being proportional to the turn off delay of transistor T2. The Schottky diode 19 shown in FIG. 1 is not essential but is helpful in the circuit of FIG. 1 for equalizing the low level signals between T1 conducting and T3 conducting.

Figure 2:
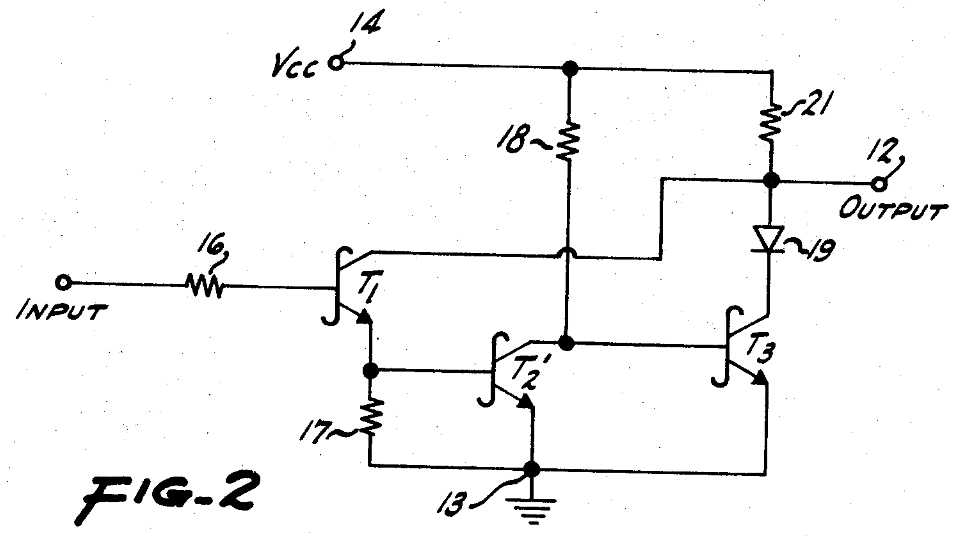
FIG. 2 is a schematic circuit diagram of another embodiment of a pulse generating circuit in accordance with this invention.

Turning now to consideration of FIG. 2, there is shown another embodiment of a pulse generating circuit according to this invention. Identical reference numerals are used in FIG. 2 for designating components identical with components shown in the circuit of FIG. 1. Thus the modification shown in FIG. 2 is to the transistor designated in FIG. 2 as transistor $T_2'$. Thus transistor $T_2'$ in FIG. 2 is shown as a Schottky effect transistor. The circuit of FIG. 2 operates in the manner identical with the circuit of FIG. 1 except that since the transistor $T_2'$ in FIG. 2 is also a Schottky effect transistor, its turn off delay is less than that of the conventional transistor T2 shown and described with respect to FIG. 1. In order for the circuit of FIG. 2 to operate so as to produce an output pulse in response to step signal change at its input in a manner similar to the operation of the circuit shown in FIG. 1, it is, of course, necessary that the turn off and turn on delay of transistor $T_2'$ be greater than the turn on and turn off delay of transistors T1 and T3. As is well known to those skilled in the art, the turn on and turn off delay time of Schottky effect transistor is dependent upon the area of metallization of the base contact overlying the base and collector semiconductor regions. The larger this area of metallization the less turn on or turn off delay there will be in the transistor switching because of the lesser effect of minority carrier storage. The switching speed thus varies inversely with the area of this metallization. Therefore, in the circuit of FIG. 2, the transistors T1 and T3 would have relatively large areas of metallization overlying the base and collector regions whereas the transistor $T_2'$ would have a smaller area of metallization overlying such base and collector regions.

The circuit of FIGS. 1 and 2 have been shown and described with reference to NPN transistors. The circuits would, of course, work equally well with PNP transistors with the polarities of the bias voltage source $V_{cc}$ and the input signal applied to input terminal 11 reversed.

Figure 3:
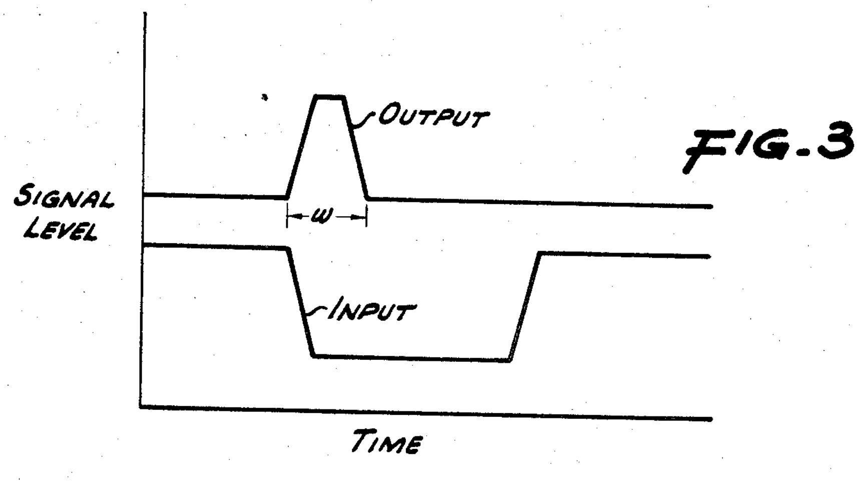
FIG. 3 is a waveform diagram showing input and output waveforms for a typical circuit in accordance with this invention.

Referring now to FIG. 3 there is shown a waveform diagram of the input and output signals for a pulse generating circuit according to this invention. Thus when the input signal goes low the output signal goes hihg. After some time the output signal goes low again to produce a pulse output having a pulse width W. This pulse width W is dependent upon the turn off delay of the transistor T2 or $T_2'$.

If a Schottky effect transistor is used as shown in FIG. 2 for transistor $T_2'$ then this pulse width W can be varied between about 3 nanoseconds and 20 nanoseconds, depending upon the metallization area of the base contact of the Schottky effect transistor $T_2'$.

Figure 4:
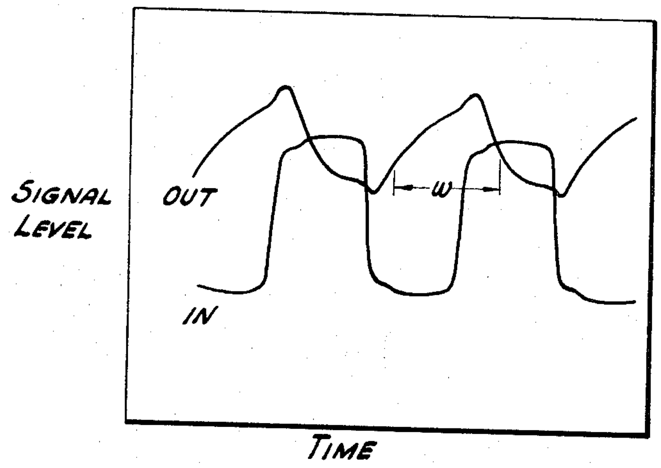
FIG. 4 is a waveform diagram copied from an actual oscilloscope trace showing the input and output waveforms of the circuit of FIG. 1.
Figure 5:
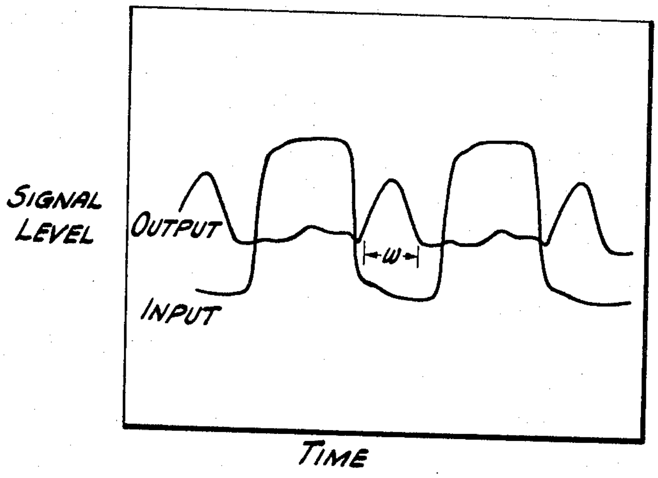
FIG. 5 is a waveform diagram of an actual oscillascope trace showing the relationship between the input and output waveforms for the circuit of FIG. 2.

Referring now to FIGS. 4 and 5, these are reproductions of actual oscilloscope traces taken of the circuits shown in FIGS. 1 and 2, respectively, with the following values for the components shown in FIGS. 1 and 2:

| | |
|---|---|
| $V_{cc}$ 5.0 Volts | |
| Resistor **16** | 800 ohms |
| Resistor **17** | 800 ohms |
| Resistor **18** | 3.9K ohms |
| Resistor **21** | 1.3K ohms |

The pulse width W shown in the output waveform in FIG. 4 was approximately 20 nanoseconds and the pulse width W in the output waveform shown in FIG. 5 was approximately 10 nanoseconds.

Figure 6:
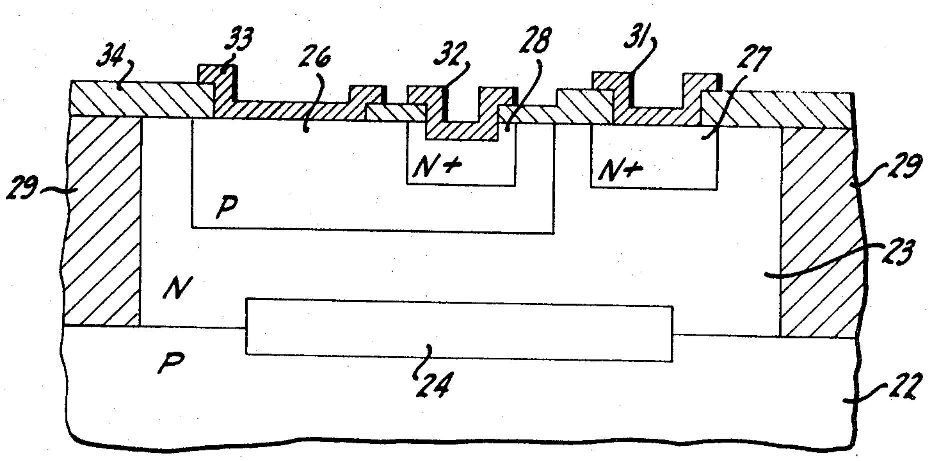
FIG. 6 is a cross-sectional diagram of the construction of transistor T2 in FIG. 1.

Referring now to FIG. 6 there is shown a cross-sectional diagram of the construction of a conventional transistor such as transistor T2 in the circuit of FIG. 1. Such a construction may include, for example, a substrate 22 surmounted by an N-type epitaxially grown area 23 and having a buried layer 24 extending between the P-type substrate 22 and the N-type epitaxially grown area 23. A P-type base region 26 is formed in the epitaxially grown area 23. An N+ diffusion 27 for making contact to the collector region 23 is also formed. An N+ diffusion 28 is also made into the base region 26 for serving as the emitter area of the transistor. Isolation regions 29 are provided to either side of the N-type epitaxially grown layer 23. Metallization 31 is provided for contacting the N+ area 27; metallization 32 is provided for contacting the N+ area 28, and metallization 23 is provided for contacting the P-type base area 26. A suitable layer of insulating material such as silicon dioxide 34 is provided for protecting the upper surfaces of the semiconductor areas. As can be seen in FIG. 6 the metallization 33 for contacting P-type base area 26 is relatively small and overlies only base region 26.

Figure 7:
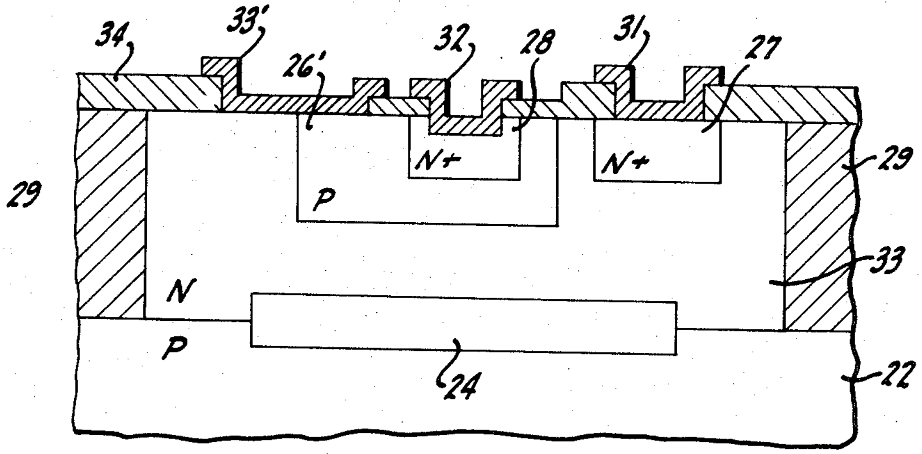
FIG. 7 is a cross-sectional diagram showing the construction of the Schottky effect transistors T1 and T3 of FIG. 1, as well as transistors T1, T2' and T3 of FIG. 2.

Referring now to FIG. 7, a cross-sectional diagram is shown of a Schottky effect transistor such as transistors T1, T3 or $T_2'$. The construction of the Schottky effect transistor shown in FIG. 7 is in most respects similar to the construction of the conventional type transistor shown in FIG. 5; thus, identical reference numerals are used in FIG. 7 as were used in FIG. 6 to refer to identical components. Thus it can be seen that in the Schottky effect transistor construction of FIG. 7 the differences are in the base area 26' and in the metallization 33' for the base contact. Thus in FIG. 7 the metallization for the base contact 33' is of much larger area than the metallization for the base contact 33 for the conventional transistor shown in FIG. 5. This metallization 33' as can be seen in FIG. 7 overlies a portion of the N-type collector region 33. The interface between this metallization 33' and the collector area 33 is a rectifying metal-semiconductor contact in which current flows predominantly by majority carrier. Such a relatively large base area contact 33' which overlies a portion of the collector region 33 greatly reduces the turn on or turn off delay time of such a Schottky effect transistor because minority carrier storage is virtually eliminated. This results in a very fast switching transistor.

While the invention has been shown and described with reference to particular embodiments thereof, it is obvious that variations to the specific embodiments shown and described would readily occur to those skilled in the art and are within the scope of this invention.

I claim:

1. In a circuit including a reference potential terminal, an input terminal and an output terminal, pulse generating means for generating a pulse at the output terminal in response to a step signal change at the input terminal comprising first, second and third transistors each having a base input electrode and collector and emitter output electrodes and capable of switching between on and off conditions, means for applying a bias voltage to said first, second and third transistors, the input base electrode of said first transistor coupled to the input terminal, one of said output collector and emitter electrodes of each of said first and third transistors coupled to the output terminal, one of said output collector and emitter electrodes of said second transistor coupled to the reference potential terminal, said other of the output collector and emitter electrodes of said first transistor coupled to said input base electrode of said second transistor and coupled through an impedance to the reference potential terminal so that the on or off condition of said second transistor follows the on or off condition of said first transistor, the other of said output collector and emitter electrodes of said third transistor coupled to the source of reference potential, the other of said output collector and emitter electrodes of said second transistor coupled to the input base electrode of said third transistor so that the on or off condition of said third transistor inversely follows the on or off condition of said second transistor, said first and third transistors being of a type having substantially less turn on and turn off delay than said second transistor.

2. Pulse generating means in accordance with claim 1 wherein said first and third transistors are Schottky effect transistors.

3. Pulse generating means in accordance with claim 1 wherein said first and third transistors are large area Schottky effect transistors and wherein said second transistor is a small area Schottky effect transistor so that said second transistor has a substantially greater turn on and turn off delay than said first and third transistors.

4. Pulse generating means in accordance with claim 3 wherein the duration of the pulse generated at the output terminal is proportional to the turn on or off delay of said second transistor.

5. In a circuit including a reference potential terminal and an input terminal and an output terminal, pulse generating means for generating a pulse at the output terminal in response to a step signal change at the input terminal comprising first, second and third transistors each having base emitter and collector electrodes, means for applying bias voltage to the collectors of said first, second and third transistors, said first transistor having its base coupled to the input terminal and its emitter coupled to the reference potential terminal, the collector of said first transistor being coupled to the output terminal, said second transistor base coupled to the emitter of said first transistor, the emitter of said second transistor also being coupled to the reference potential terminal, the collector of said second transistor being coupled to the base of said third transistor, the collector of said third transistor being coupled to the output terminal and the emitter of said third transistor being coupled to the reference potential terminal, and said first and third transistors being of a type having substantially less turn on and turn off delays than said second transistor.

6. Pulse generating means in accordance with claim 5 wherein said first and third transistors are Schottky effect transistors.

7. Pulse generating means in accordance with claim 5 wherein said first and third transistors are large areas Schottky effect transistors and wherein said second transistor is a small area Schottky effect transistor so that said second transistor has substantially greater turn on and turn off delay than said first and third transistors.

8. Pulse generating means in accordance with claim 7 wherein the duration of the pulse generated at the output terminal is proportional to the turn off delay of said second transistor.

9. Pulse generating means in accordance with claim 8 including a Schottky diode connected between the collector of said third transistor and the output terminal.

* * * * *